(12) United States Patent
Hirano

(10) Patent No.: US 6,225,665 B1
(45) Date of Patent: May 1, 2001

(54) SEMICONDUCTOR DEVICE HAVING MULTIPLE SOURCE REGIONS

(75) Inventor: Yuuichi Hirano, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/346,266

(22) Filed: Jul. 1, 1999

(30) Foreign Application Priority Data

Jan. 11, 1999 (JP) .................................................. 11-003913

(51) Int. Cl.[7] .................................................. H01L 29/00
(52) U.S. Cl. .......................... 257/347; 257/348; 257/349; 257/350; 257/351; 257/352; 257/353; 257/354; 257/355
(58) Field of Search ...................... 257/347–355

(56) References Cited

U.S. PATENT DOCUMENTS 5,854,561 * 12/1998 Arimito et al. ...................... 327/534

FOREIGN PATENT DOCUMENTS 6-232405   8/1994  (JP) .

OTHER PUBLICATIONS

"Silicon–on–insulator Technology", Kluwer Academic Publishers, 1997, p. 117, Figures, 4.5.3 and 4.6.2.
Yo–Hwan Koh, et al. "BC (Body–Contacted) SOI–CMOS Technology and Its Application to High Density Memory", Extended Abstracts of the 1998 International Conference on Solid State Devices and Materials, 1998, pp. 306–307.

* cited by examiner

Primary Examiner—Fetsum Abraham
(74) Attorney, Agent, or Firm—Oblon, Spivak, McClelland, Maier & Neustadt, P.C.

(57) ABSTRACT

In a region on the left hand of FIG. 1 with respect to the gate electrode (107), a first source region (103a), a body-potential drawing region (105) and a second source region (103b) are formed in this order along the vertical direction of this figure. The first and second source regions (103a, 103b) are of n+ type, and the body-potential drawing region (105) is of p+ type. In a thin-film transistor (100), the body-potential drawing region (105) can draw and fix a body potential.

12 Claims, 12 Drawing Sheets

F I G. 13A
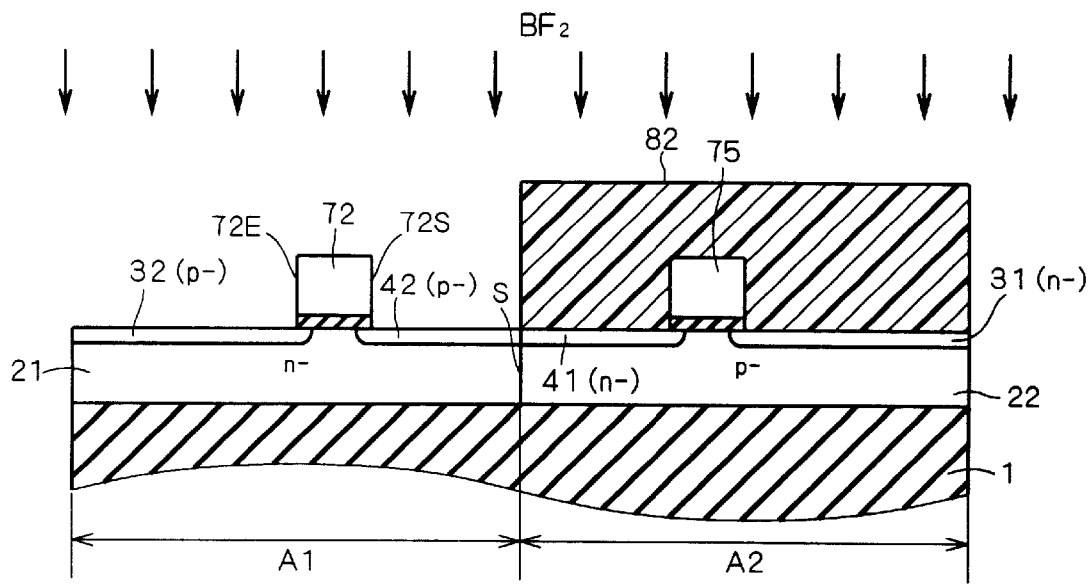
F I G. 13B
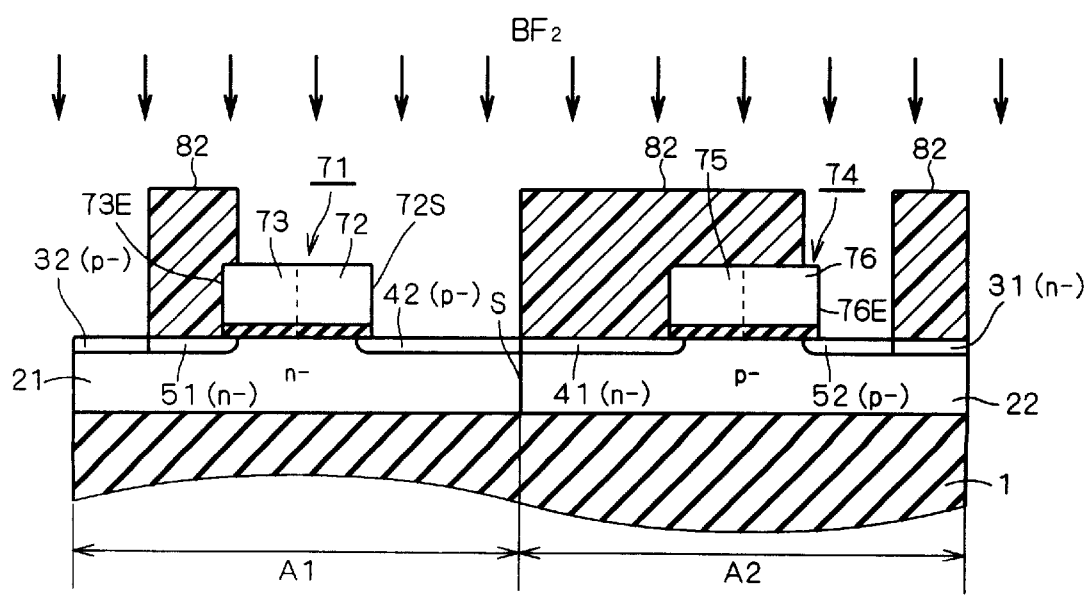

US 6,225,665 B1

SEMICONDUCTOR DEVICE HAVING MULTIPLE SOURCE REGIONS

BACKGROUND OF THE INVENTION

1. Field of the Invention

The present invention relates to an SOI (Semiconductor On Insulator) type thin-film transistor, and more particularly to a technique for fixing a potential of its body (referred to as "body potential" hereinafter).

2. Description of the Background Art

FIG. 18 is a cross-sectional view illustrating a structure of a general SOI type thin-film transistor 900. The thin-film transistor 900 is formed as an n-channel MOS transistor in a semiconductor layer 902 provided on an insulator 901. The insulator 901 may be formed as a buried layer in a not-shown semiconductor substrate.

In the $p^-$ type semiconductor layer 902, a source region 903 and a drain region 904 both of which are $n^+$ type semiconductor layers are provided at a distance from each other. The semiconductor layer 902 sandwiched by the source region 903 and the drain region 904 is termed "body" of the thin-film transistor 900. Above the body, a gate electrode 907 made of e.g., polysilicon is provided with a gate insulating film 906 interposed therebetween.

Since the semiconductor layer 902 is provided on the insulator 901, its body potential is in a floating state in the structure of FIG. 18. In this state, there are possibilities of generation of leak current and unstable operation of the thin-film transistor 900 due to variations in power-supply level and ground level and parasitic bipolar effect. The parasitic bipolar effect here refers simply to a phenomenon that positive holes created by impact ionization are accumulated in the body and the body potential thereby rises to increase a leak current in the thin-film transistor 900 as an n-channel MOS transistor.

There may be a case where a cosmic ray such as an α ray enters the body to form a pair of an electron and a positive hole. Since the thin-film transistor 900 is used in a state where a channel is formed by inverting a surface of the body into n type, the positive hole is accumulated, though the electron is drawn out, to raise a possibility of inviting a rise of body potential.

To solve the above problem, a technique for fixing the body potential has been proposed. FIG. 19 is a cross-sectional view of a first technique in the prior art, illustrating a structure of a thin-film transistor 800 and a structure for fixing its body potential. The thin-film transistor 800 comprises a $p^-$ type semiconductor layer 802 as a body formed on an insulator 801 and a source region 803 and a drain region 804 both of which are of $n^+$ type and provided thereabove. Above the body, a gate electrode 807 is provided with a gate insulating film 806 interposed therebetween.

Alongside the thin-film transistor 800, an isolation oxide film 809 is formed by LOCOS oxidization of the semiconductor layer 802. Below the isolation oxide film 809, above the insulator 801, a region 805a is formed by enhancing the conductivity of the semiconductor layer 802. On the opposite side of the thin-film transistor 800 with respect to the isolation oxide film 809, a p type region 805b and a $p^+$ type region 805c are layered on the insulator 801 in this order. The regions 805a, 805b and 805c adjoin the semiconductor layer 802 in this order, and when a potential VB is applied to the region 805c, the body potential can be fixed at a position away from the thin-film transistor 800 with the isolation region 809 interposed.

Since the first background-art technique, however, uses the isolation oxide film 809, it is not suitable for integration. Further, a structure much like that of FIG. 19, where the p type semiconductor layer is provided between the source region and the insulator to draw the positive hole, is disclosed in, for example, Japanese Patent Application Laid Open Gazette No. 6-232405.

On the other hand, the thin-film transistor is often used with the potential applied to the source region (referred to simply as "source potential") and the body potential being equal, and on the premise of such a use, a structure for fixing the body potential can be formed locally in the source region. FIG. 20 is a plan view illustrating a structure of a thin-film transistor 700 that is advantageous from this viewpoint. The second technique in the background art is disclosed in, for example, "Silicon-on-insulator technology: materials to VLSI" by J. P. Colinge (Kluwer Academic Publishers, 2nd Ed.).

With the gate electrode 707 centered, on the left hand of this figure provided are an $n^+$ type source region 703 and $p^+$ type body-potential drawing regions 705a and 705b which sandwich the region 703 vertically in this figure, and on the right hand of this figure provided is a drain region 704. A contact structure for supplying the body potential and the source potential is formed at a contact region 310 provided covering part of the body-potential drawing regions 705a and 705b across the source region 703. This structure eliminates the necessity of the LOCOS oxide film used in the first background-art technique, thereby being suitable for integration.

The second background-art technique, however, has great problems as follows. The first problem is due to the position of the body-potential drawing region 705a. The body is provided in the back of the gate electrode 707 in this figure, though not shown, and a channel is formed mainly in a portion surrounded by the source region 703, the drain region 704 and the gate electrode 707. From this portion, the positive hole should be drawn.

In the structure of FIG. 20, the body-potential drawing regions 705a and 705b are positioned at an end of the source region 703 along a direction where the gate electrode 707 extends (in a vertical direction of this figure). Therefore, in order to effectively draw the positive hole from the body, a pair of body-potential drawing regions 705a and 705b are needed. For example, if the body-potential drawing region 705a is not provided, the body-potential drawing region 705b can not effectively draw the positive hole from a portion on the upper side of this figure in the body. This needs a larger area for the body-potential drawing regions 705a and 705b, and a portion which does not function as a channel in a direction (gate width) where the gate electrode 707 extends increases in width. That inhibits integration of the thin-film transistor.

The second problem becomes pronounced in a case where the gate electrode 707 is made of polysilicon and the like. Impurity implantations for forming the source region and the drain region are performed, in general, by using the gate electrode and the gate insulating film provided between the gate electrode and the body as a mask in a self-aligned manner. When an impurity to be implanted into the polysilicon to enhance the conductivity as the gate electrode is equivalent in conductivity to those for the source region and the drain region, the conductivity of the gate electrode is obtained by impurity implantation for forming the source region and the drain region.

If a p type impurity is implanted to also form the $p^+$ type body-potential drawing regions 705a and 705b of FIG. 20 in a self-aligned manner, however, an effect of the n type impurity which the gate electrode 707 has is counter-doped. The gate electrode 707 comprises a straight portion 707b which is straight in a direction where the gate electrode 707 extends and a contact portion 707a in which a contact structure is formed to apply a predetermined electrical signal to the gate electrode. The conductivity is degraded in portions 401a and 401b of the straight portion 707b near the p+ type body-potential drawing regions 705a and 705b at an end (on the left hand of FIG. 20) in a direction horizontal direction of this figure) orthogonal to the direction where the straight portion 707b extends. This phenomenon becomes especially pronounced in the portion 401b near the contact portion 707b because transmission of signals to the straight portion 707b is degraded.

Even if a mask is used to selectively implant the p type impurity to form the p+ type body-potential drawing regions 705a and 705b out of the self-aligned manner, a margin for alignment of the mask is needed in order to surely bring the body-potential drawing regions 705a and 705b into contact with the body, and implantation of the p type impurity into the gate electrode 707 can not be virtually avoided.

SUMMARY OF THE INVENTION

The present invention is directed to a semiconductor device. According to a first aspect of the present invention, the semiconductor device comprises: an insulator; a first semiconductor layer of a first conductivity type, having a first main surface adjacent to the insulator and a second main surface on the opposite side to the first main surface; an insulating layer provided on the second main surface; a control electrode provided on the insulating layer extending in a first direction, immediately below which the first semiconductor layer is divided into first and second regions along a second direction orthogonal to the first direction; a second semiconductor layer of a second conductivity type opposite to the first conductivity type provided in the first region; and a third semiconductor layer, a fourth semiconductor layer and a fifth semiconductor layer of the first conductivity type, the second conductivity type and the first conductivity type, respectively, provided in the second region extending from the second main surface to the first main surface and exposed in this order on the second main surface along a side end of the control electrode on a side of the first region.

Preferably, the third, fourth and fifth semiconductor layers have the same length along the second direction.

Preferably, the length of the fourth semiconductor layer along the second direction is shorter than those of the third and fifth semiconductor layers along the second direction.

Preferably, the third semiconductor layer and the fifth semiconductor layer are connected farther away from the control electrode than an end portion of the fourth semiconductor layer away from the control electrode.

According to a second aspect of the present invention, in the semiconductor device of the first aspect, the control electrode has a straight portion extending in the first direction; and a wide portion widened in the second direction at a position of the fourth semiconductor layer in the first direction.

Preferably, the length of the fourth semiconductor layer along the second direction is shorter than those of the third and fifth semiconductor layers in the second direction.

Preferably, the third semiconductor layer and the fifth semiconductor layer are connected farther away from the control electrode than an end portion of the fourth semiconductor layer away from the control electrode.

According to a third aspect of the present invention, the semiconductor device comprises: a pair of semiconductor elements each including an insulator; a first semiconductor layer of a first conductivity type, having a first main surface adjacent to the insulator and a second main surface on the opposite side to the first main surface; an insulating layer provided on the second main surface; a control electrode provided on the insulating layer extending in a first direction, immediately below which the first semiconductor layer is divide into first and second regions along a second direction orthogonal to the first direction, and having a straight portion extending in the first direction and a wide portion widened in the second direction at a position of the fourth semiconductor layer in the first direction; a second semiconductor layer of a second conductivity type opposite to the first conductivity type provided in the first region; and a third semiconductor layer, a fourth semiconductor layer and a fifth semiconductor layer of the first conductivity type, the second conductivity type and the first conductivity type, respectively, provided in the second region extending from the second main surface to the first main surface and exposed in this order on the second main surface along a side end of the control electrode on a side of the first region, and a pair of the wide portions being widened in opposite directions to each other.

Preferably, the pair of wide portions are widened in such directions as to go away from a boundary between the pair of semiconductor elements.

Preferably, the third semiconductor layer and the fifth semiconductor layer are connected farther away from the control electrode than an end portion of the fourth semiconductor layer away from the control electrode.

The present invention is also directed to a method of manufacturing a semiconductor device. According to a fourth aspect of the present invention, the method comprises the steps of: (a) forming a first semiconductor layer of a first conductivity type on an insulator, which has a first main surface adjacent to the insulator and a second main surface on the opposite side to the first main surface; (b) forming a first insulating layer on the second main surface of the first semiconductor layer; (c) forming a first control electrode having a straight portion provided on the first insulating layer extending in a first direction and a wide portion extending from the straight portion along a second direction opposite to the first direction; (d) introducing a first impurity of the first conductivity type into the first semiconductor layer using at least an end of the wide portion of the first control electrode as a mask to form a second semiconductor layer; and (e) introducing a second impurity of a second conductivity type opposite to the first conductivity type into the first semiconductor layer using the first control electrode and a shield covering the second semiconductor layer as masks to form a third semiconductor layer and a fourth semiconductor layer of the second conductivity type sandwiching the first semiconductor layer below the straight portion.

According to a fifth aspect of the present invention, in the method of the fourth aspect, the step (a) has the step of forming a fifth semiconductor layer of the second conductivity type, which has a first main surface adjacent to the insulator and a second main surface on the opposite side to the first main surface thereof and is adjacent to the first semiconductor layer with a boundary therebetween, the step (b) has the step of forming a second insulating layer on the second main surface of the fifth semiconductor layer, the step (c) has the step of forming a second control electrode which has a straight portion provided on the second insulating layer extending in the first direction and a wide portion extending from the straight portion along the second direction, the first impurity is introduced in the step (d) using a first shield covering a position at a predetermined distance or more from an end of the wide portion of the first control electrode, a range from the straight portion of the first control electrode to the boundary and a range within a predetermined distance from an end of the wide portion of the second control electrode, the second impurity is introduced in the step (e) using a second shield covering a position at a predetermined distance or more from the end of the wide portion of the second control electrode, a range from the straight portion of the second control electrode to the boundary and a range within a predetermined distance from the end of the wide portion of the first control electrode, the method further comprising the steps of: (f) introducing a third impurity of the first conductivity type using a third shield having the same pattern as the first shield before the steps (d) and (e); and (g) introducing a fourth impurity of the second conductivity type using a fourth shield having the same pattern as the second shield before the steps (d) and (e).

Preferably, the wide portion of the first control electrode and the wide portion of the second control electrode are extended in opposite directions.

Preferably, both the first control electrode and the second control electrode are widened in such directions as to go away from the boundary.

In the semiconductor device of the first aspect of the present invention, since the fourth semiconductor layer is provided over the whole thickness of the first semiconductor layer, the potential of the first semiconductor layer, i.e., the body potential can be fixed by the fourth semiconductor layer. Since the fourth semiconductor layer is sandwiched between the third and fifth semiconductor layers along the direction where the control electrode extends, drawing of carries associated with fixing of the body potential can be performed more effectively from the first semiconductor layer between the second and third semiconductor layers and from the first semiconductor layer between the second and fifth semiconductor layers, as compared with a case where the fourth semiconductor layer is positioned at an end portion in the direction where the control electrode extends, and does not require a large area of the fourth semiconductor layer. Furthermore, since the third, fourth and fifth semiconductor layers are formed over the whole thickness of the first semiconductor layer, it is possible to suppress an effect of a pn junction, e.g., parasite of junction capacitance.

In the semiconductor device of the second aspect of the present invention, since the conductivity of the straight portion is hard to deteriorate even if the conductivity of the wide portion in the control electrode positioned near the fourth semiconductor layer is deteriorated, it is possible to avoid deterioration of function of the control electrode.

In the semiconductor device of the third aspect and the method of manufacturing semiconductor device of the sixth aspect of the present invention, wiring of a power-supply line can be easily performed when an inverter is constituted of a pair of semiconductor devices.

In the method of manufacturing a semiconductor device of the fourth aspect of the present invention, since the first impurity is introduced into the fist semiconductor layer by using the wide portion as a mask in the step (d), it is possible to avoid introduction of the first impurity into the straight portion when the second semiconductor layer which is adopted as a region for drawing the body potential is formed.

Therefore, the conductivity of the straight portion is not deteriorated. Further, since introduction of the second impurity into the second semiconductor layer is suppressed in the step (e), the conductivity of a region for drawing the body potential is not deteriorated.

In the method of manufacturing a semiconductor device of the fifth aspect of the present invention, since the first and third shields have the same pattern and the second and fourth shields have the same pattern, the LDD structure can be obtained while the photomask is diverted.

An object of the present invention is to provide a new structure for drawing the body potential of the SOI type thin-film transistor and a method of manufacturing the same.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 11A to 16B are cross-sectional views sequentially showing manufacturing steps in accordance with the fourth preferred embodiment of the present invention;

DESCRIPTION OF THE PREFERRED EMBODIMENTS

The First Preferred Embodiment

Figure 1:
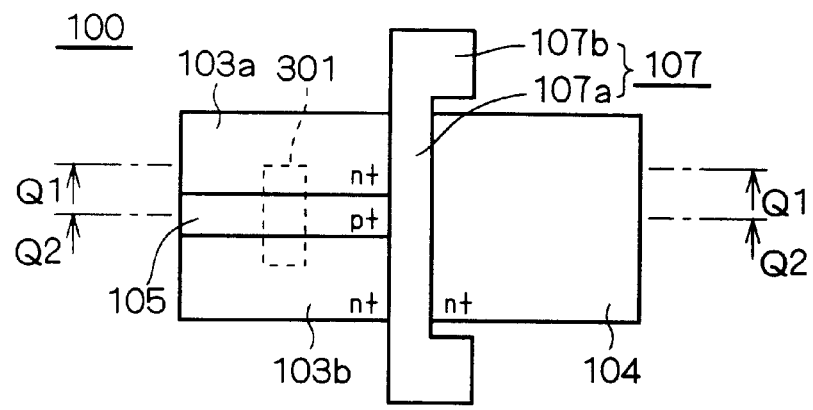
FIG. 1 is a plan view showing a structure in accordance with a first preferred embodiment of the present invention.
Figure 2:
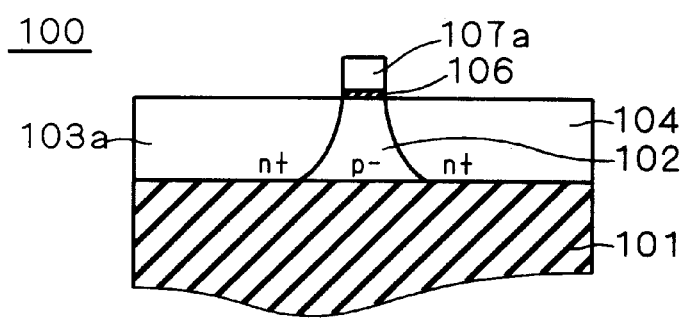
FIGS. 2 and 3 are cross-sectional views each showing the structure in accordance with the first preferred embodiment of the present invention.
Figure 3:
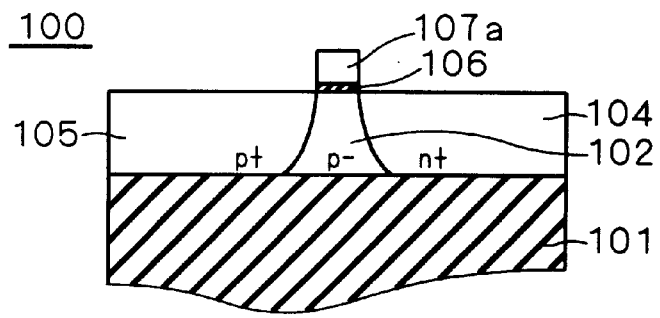

FIG. 1 is a plan view showing a structure of a thin-film transistor 100 in accordance with the first preferred embodiment of the present invention, and FIGS. 2 and 3 are cross-sectional views showing sections taken along the positions Q1—Q1 and Q2—Q2 of FIG. 1, respectively.

The thin-film transistor 100 is formed on an insulator 101 which may be formed as a buried layer in a not-shown semiconductor substrate. Specifically, a lower surface of a p⁻ type semiconductor layer 102 adjoins the insulator 101 and on an upper surface thereof, a straight portion 107a of a gate electrode 107 is formed with a gate insulating film 106 interposed therebetween. The gate electrode 107 has a contact portion 107b in which a contact structure is formed to apply a predetermined electrode signal to the gate electrode at both ends of the straight portion 107a. Instead of paired contact portions 107b, only one of them may be provided.

The straight portion 107a of the gate electrode 107 extends in a first direction which is vertical in FIG. 1, immediately below which the semiconductor layer 102 is divided along a second direction which is horizontal of FIGS. 1 to 3. In the semiconductor layer 102 on the right hand of FIGS. 1 to 3, an n$^+$ type drain region 104 is provided extending from the upper surface to the lower surface of the semiconductor layer 102.

On the other hand, in the semiconductor layer 102 on the left hand of FIGS. 1 to 3, a first source region 103a, a body-potential drawing region 105 and a second source region 103b are formed in this order in the first direction. The first and second source regions 103a and 103b are of n$^+$ type and the body-potential drawing region 105 is of p$^+$ type. These are formed extending from the upper surface to the lower surface of the semiconductor layer 102. The positions Q1—Q1 and Q2—Q2 are found at positions in the first direction where the first source region 103a exists and the body-potential drawing region 105 exists, respectively.

In the thin-film transistor 100, since the body-potential drawing region 105 is provided over the whole thickness of the semiconductor layer 102, a potential of the semiconductor layer 102, i.e., the body potential, can be fixed by the body-potential drawing region 105. For example, as shown in FIG. 1, when a contact structure is formed in a contact region 301 covering part of the first source region 103a and part of the second source region 103b across the body-potential drawing region 105, the source potential can be used also as the body potential.

Figure 20:
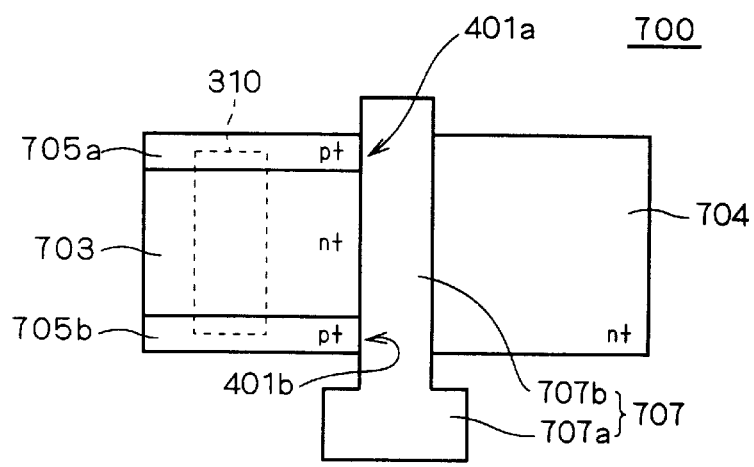
FIG. 20 is a plan view showing a second technique in the background art.

Since the body-potential drawing region 105 is disposed between the first and second source regions 103a and 103b along a direction where the straight portion 107a of the gate electrode 107 extends, drawing of a positive hole by the body-potential drawing region 105 can be more effectively performed from the semiconductor layer 102 between the first source region 103a and the drain region 104 and the semiconductor layer 102 between the second source region 103b and the drain region 104, as compared with the case where the body-potential drawing regions 705a and 705b are disposed at ends of the first direction where the straight portion 707b extends in the thin-film transistor 700 having the structure of FIG. 20, to thereby solve the first problem. In other words, an area of the body-potential drawing region 105 relative to the length of the gate electrode 107 along the first direction can be reduced.

Figure 19:
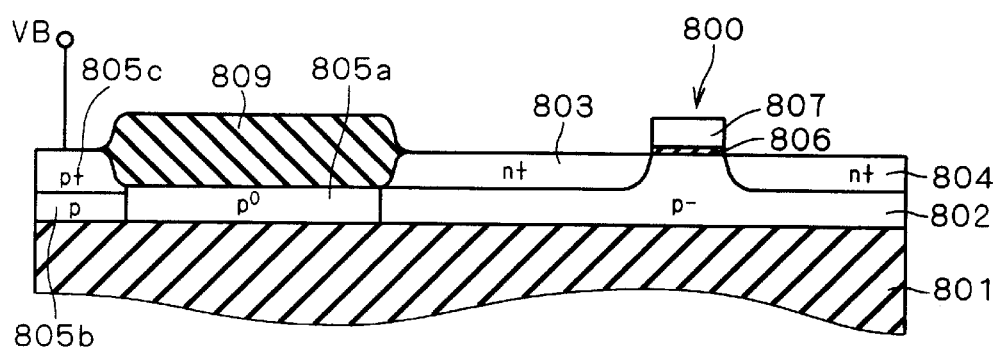
FIG. 19 is a cross-sectional view showing a first technique in the prior art.

Further, since the first source region 103a, the body-potential drawing region 105 and the second source region 103b are formed over the whole thickness of the semiconductor layer 102, unlike the thin-film transistor 800 having the structure of FIG. 19 where the semiconductor layer 802 exists between the source region 803 and the insulator 801, it is possible to suppress an effect of a pn junction, e.g., parasite of junction capacitance.

The Second Preferred Embodiment

Figure 4:
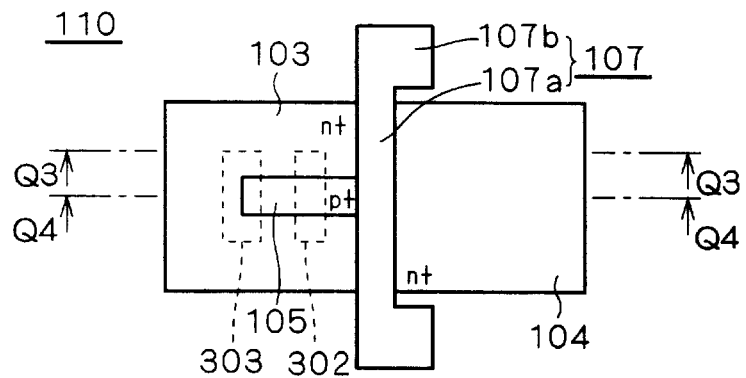
FIG. 4 is a plan view showing a structure in accordance with a second preferred embodiment of the present invention.
Figure 5:
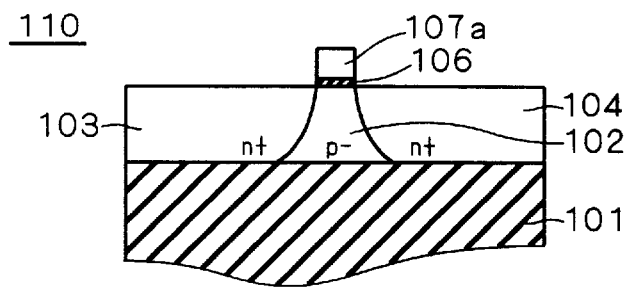
FIGS. 5 and 6 are cross-sectional views each showing the structure in accordance with the second preferred embodiment of the present invention.
Figure 6:
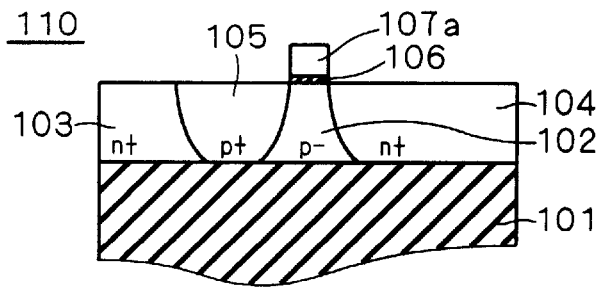

FIG. 4 is a plan view showing a structure of a thin-film transistor 110 in accordance with the second preferred embodiment of the present invention, and FIGS. 5 and 6 are cross-sectional views showing sections taken along the positions Q3—Q3 and Q4—Q4 of FIG. 4, respectively.

The thin-film transistor 110 is different from the thin-film transistor 100 of the first preferred embodiment only in structure where the source region and the body-potential drawing region are formed in the semiconductor layer on the left hand with a portion immediately below the straight portion 107a of the gate electrode 107 as a boundary. While the first and second source regions 103a and 103b are separated from each other by the body-potential drawing region 105 in the thin-film transistor 100, a source region 103 is connected on a side of the body-potential drawing region 105 opposite to the gate electrode 107 in the thin-film transistor 110 as shown in FIG. 4. The source region 103 and the body-potential region 105 are formed extending from the upper surface to the lower surface of the semiconductor layer 102, like in the first preferred embodiment.

The positions Q3—Q3 and Q4—Q4 are found at positions in the first direction along the gate electrode 107 where the first source region 103 exists and the body-potential drawing region 105 exists, respectively. As shown in FIG. 6, since a right end of the body-potential drawing region 105 in this figure comes into contact with the semiconductor layer 102, this preferred embodiment can produce the same effect as the first preferred embodiment.

Further, in this case, a contact structure for applying the source potential as the body potential may not include a left end of the body-potential drawing region 105 in this figure like a contact region 302, and may include the left end of the body-potential drawing region 105 in this figure like a contact region 303.

The Third Preferred Embodiment

Figure 7:
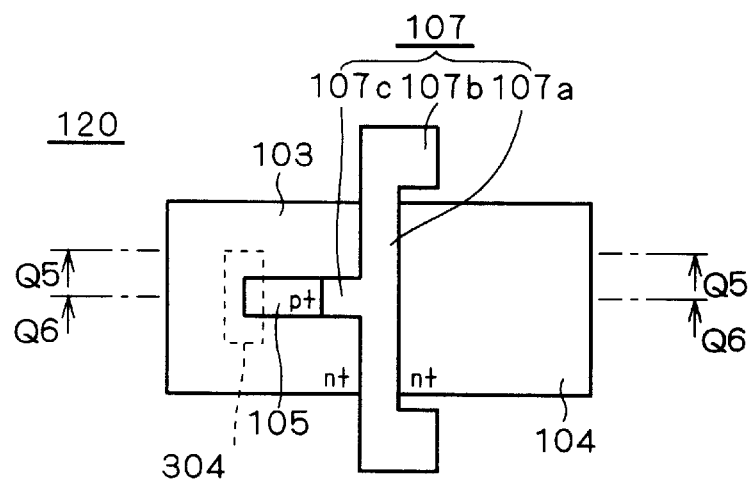
FIG. 7 is a plan view showing a structure in accordance with a third preferred embodiment of the present invention.
Figure 8:
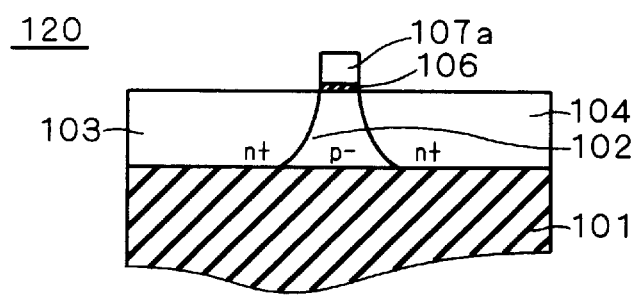
FIGS. 8 and 9 are cross-sectional views each showing the structure in accordance with the third preferred embodiment of the present invention.
Figure 9:
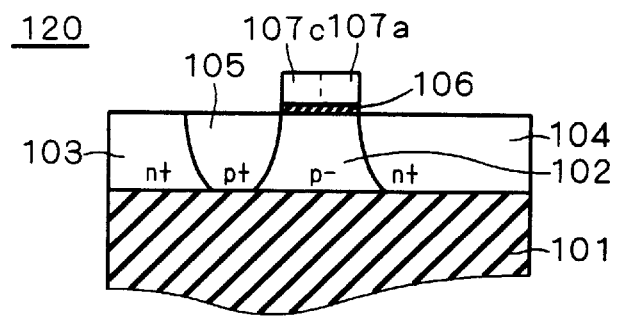

FIG. 7 is a plan view showing a structure of a thin-film transistor 120 in accordance with the third preferred embodiment of the present invention, and FIGS. 8 and 9 are cross-sectional views showing sections taken along the positions Q5—Q5 and Q6—Q6 of FIG. 7, respectively.

The thin-film transistor 120 is different from the thin-film transistor 110 of the second preferred embodiment in that a wide portion 107c is attached to the straight portion 107a of the gate electrode 107. The wide portion 107b is widened from the straight portion 107a leftward in this figure at the position of the body-potential drawing region 105 in the first direction. Because of existence of the wide portion 107c, the right end of the body-potential drawing region 105 in this figure moves leftward. In other words, the body-potential drawing region 105 is surrounded by the source region 103 and the semiconductor layer 102 below the wide portion 107b.

In this structure, even if the p type impurity implantation for forming the body-potential drawing region 105 is performed also to the wide portion 107c of the gate electrode 107, the conductivity of the straight portion 107a is kept. Therefore, the second problem can be also solved. It is natural that the left end of the body-potential drawing region 105 reaches a left end of the source region 103 in this figure. A specific method of forming the body-potential drawing region 105 will be discussed in the fourth preferred embodiment.

In the first to third preferred embodiments, there may be a case where a first n type impurity implantation is performed by using the gate electrode 107 as a mask, side walls are formed on the gate electrode 107 and a second n type impurity implantation in which the impurity concentration is higher than that of the first n type impurity implantation is performed by using the side walls and the gate electrode 107 as masks, to form an LDD (Light Doped Drain) structure. Further, these preferred embodiments can be naturally applied to a p channel MOS transistor.

The Fourth Preferred Embodiment

Figure 10:
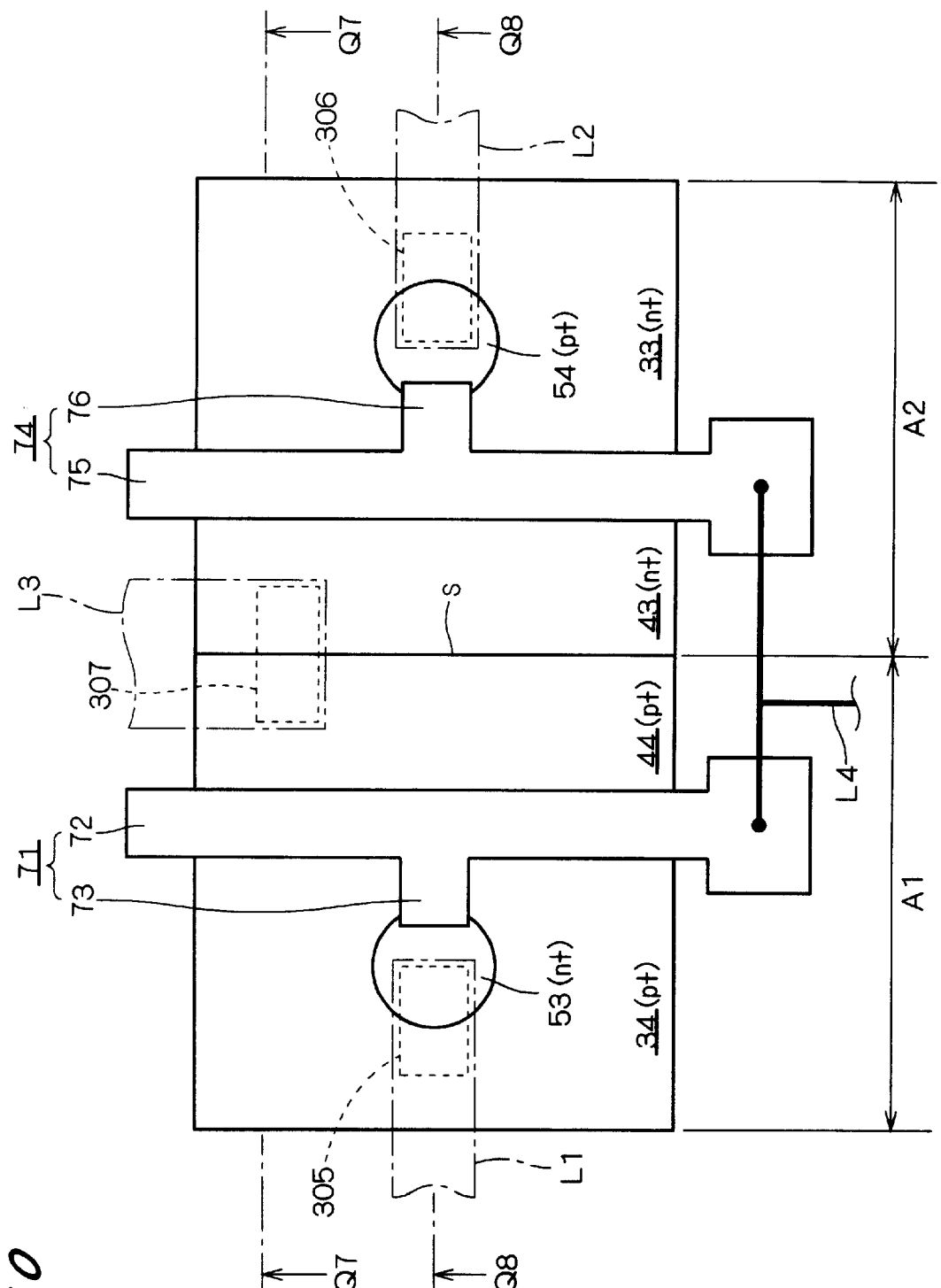
FIG. 10 is a plan view showing a structure in accordance with a fourth preferred embodiment of the present invention.
Figure 17A:
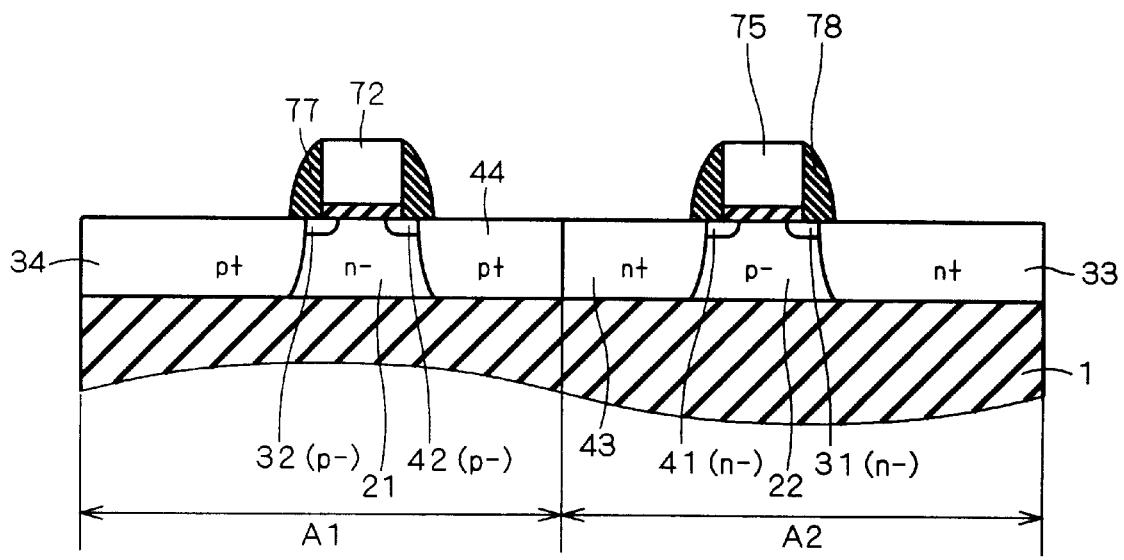
FIGS. 17A and 17B are cross-sectional views each showing the structure in accordance with the fourth preferred embodiment of the present invention.
Figure 17B:
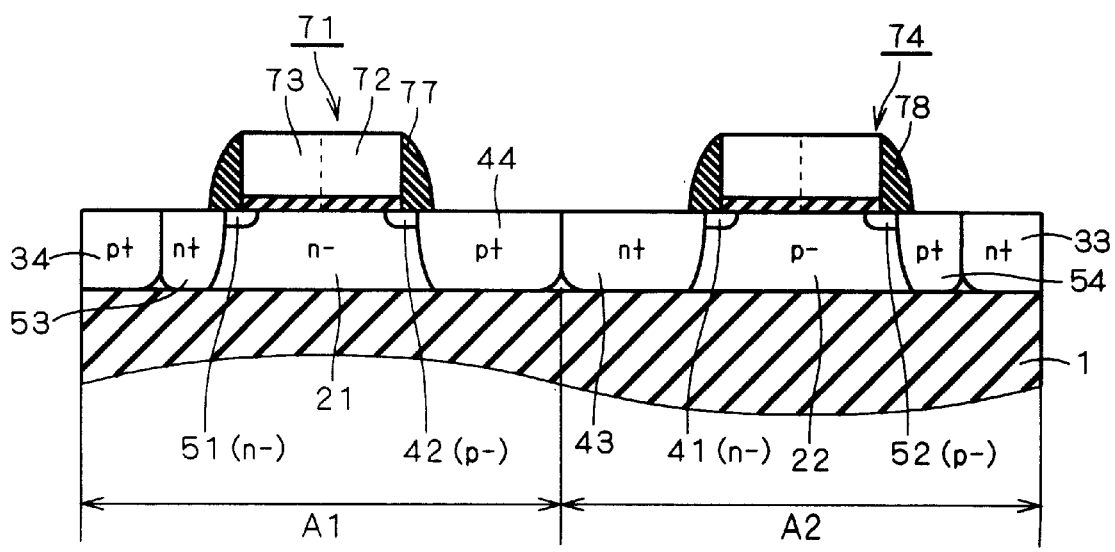
Figure 18:
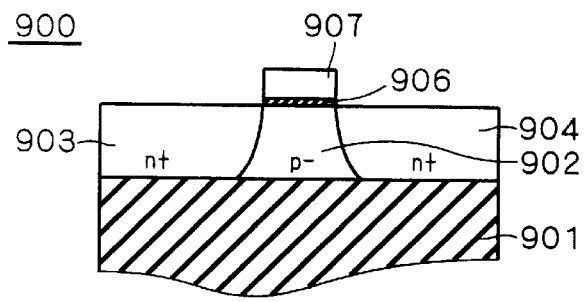
FIG. 18 is a cross-sectional view showing a general technique.

FIG. 10 is a plan view showing a structure of a CMOS transistor in accordance with the fourth preferred embodiment of the present invention, and FIGS. 17A and 17B are cross-sectional views showing sections taken along the positions Q7—Q7 and Q8—Q8 of FIG. 10, respectively. A PMOS transistor having an LDD structure is formed in a region A1 and an NMOS transistor having an LDD structure is formed in a region A2. The regions A1 and A2 adjoin each other, forming a boundary S. The PMOS transistor comprises a p+ type source region 34, a p+ type drain region 44 and a p+ type gate electrode 71, and the NMOS transistor comprises an n+ type source region 33, an n+ type drain region 43 and an n+ type gate electrode 74. The source region 34 and the drain region 44 are provided to sandwich a semiconductor layer 21 below the gate electrode 71, and the source region 33 and the drain region 43 are provided to sandwich a semiconductor layer 22 below the gate electrode 74.

The gate electrode 71 comprises a straight portion 72 and a wide portion 73, corresponding to the straight portion 107a and the wide portion 107c of the thin-film transistor 120, respectively. Similarly, the gate electrode 74 comprises a straight portion 75 and a wide portion 76. In FIG. 10, for simple illustration, the side walls 77 and 78 adjacent to the gate electrode 71 and 74, respectively, are included in the gate electrodes 71 and 74.

Like the body-potential drawing region 105, an n+ type body-potential drawing region 53 is surrounded by the source region 34 and the semiconductor layer 21 below the wide portion 73. A p+ type body-potential drawing region 54 is surrounded by the source region 33 and the semiconductor layer 22 below the wide portion 76.

Since the wide portions 73 and 76 protrude to opposite sides with respect to the boundary S, a connecting line L1 connected to both the source region 34 and the body-potential drawing region 53 of the PMOS transistor at a contact 305 (neither the line L1 nor the contact 305 is shown in FIG. 17B) and a connecting line L2 connected to both the source region 33 and the body-potential drawing region 54 of the NMOS transistor at a contact 306 (neither the line L2 nor the contact 306 is shown in FIG. 17B) are extended towards opposite directions to each other (leftward and rightward in this figure) with respect to the boundary S.

Further, the gate electrodes 71 and 74 are connected in common with a connecting line L4, and the drain regions 43 and 44 are connected to a connecting line L3 with a contact 307 across the boundary S (neither the line L3 nor the contact 307 is shown in FIG. 17A). The connecting lines L3 and L4 are extended towards opposite directions (upward and downward in this figure) with respect to the respective CMOS transistors.

Even when the connecting lines L1 and L2 are connected to a high potential and a low potential, respectively, a CMOS inverter can be obtained where power-supply lines for supplying these potentials are easily placed without crossing the gate electrodes 71 and 74 and the connecting line L3.

FIGS. 11A to 16B are cross-sectional views sequentially showing the steps of manufacturing the structure of FIGS. 10 and 17A and 17B. FIGS. 11A, 12A, 13A, 14A, 15A and 16A are cross-sectional views taken along the position Q7—Q7 of FIG. 10, and FIGS. 11B, 12B, 13B, 14B, 15B and 16B are cross-sectional views taken along the position Q8—Q8 of FIG. 10.

Figure 11A:
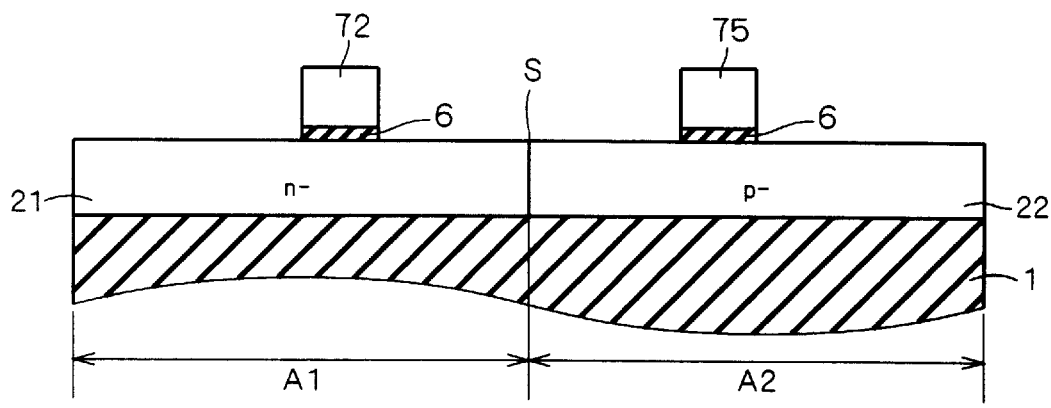
Figure 11B:
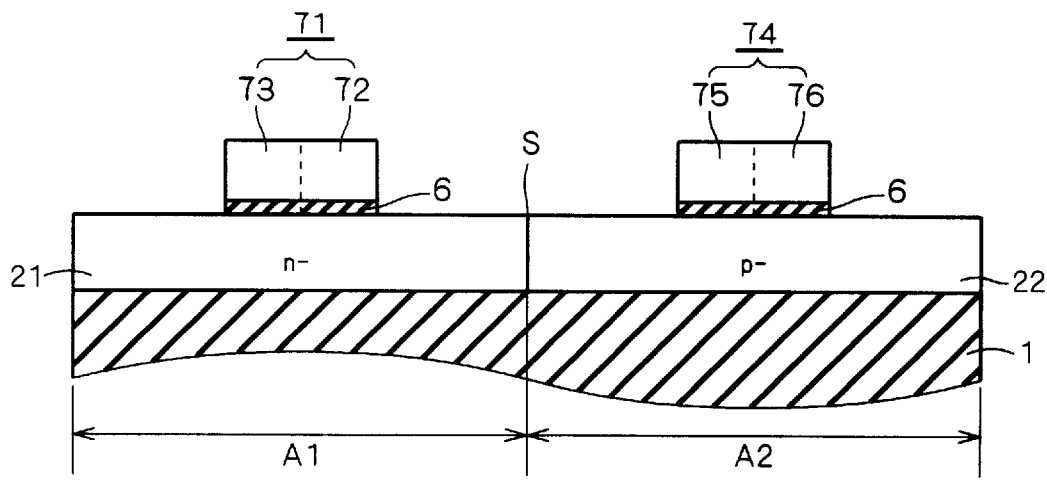

In FIGS. 11A and 11B, the n⁻ type semiconductor layer 21 and the p⁻ type semiconductor layer 22 are formed adjacently to each other at the boundary S on an insulator 1 which may be formed as a buried layer in a not-shown semiconductor substrate. On the semiconductor layers 21 and 22, the gate electrodes 71 and 74 are formed, respectively, with the gate insulating films 6 interposed. As a material of the insulator 1, for example, a silicon oxide is used. As a material of the semiconductor layers 21 and 22, for example, a silicon is used. As a material of the gate electrodes 71 and 74, for example, a polysilicon is used.

In FIG. 11A, only the straight portions 72 and 75 appear as the gate electrodes 71 and 74, respectively, while in FIG. 11B, the wide portions 73 and 76 as well as the straight portions 72 and 75 appear as the gate electrodes 71 and 74, respectively. The straight portions 72 and 75 are extended almost in parallel to the boundary S.

Figure 12A:
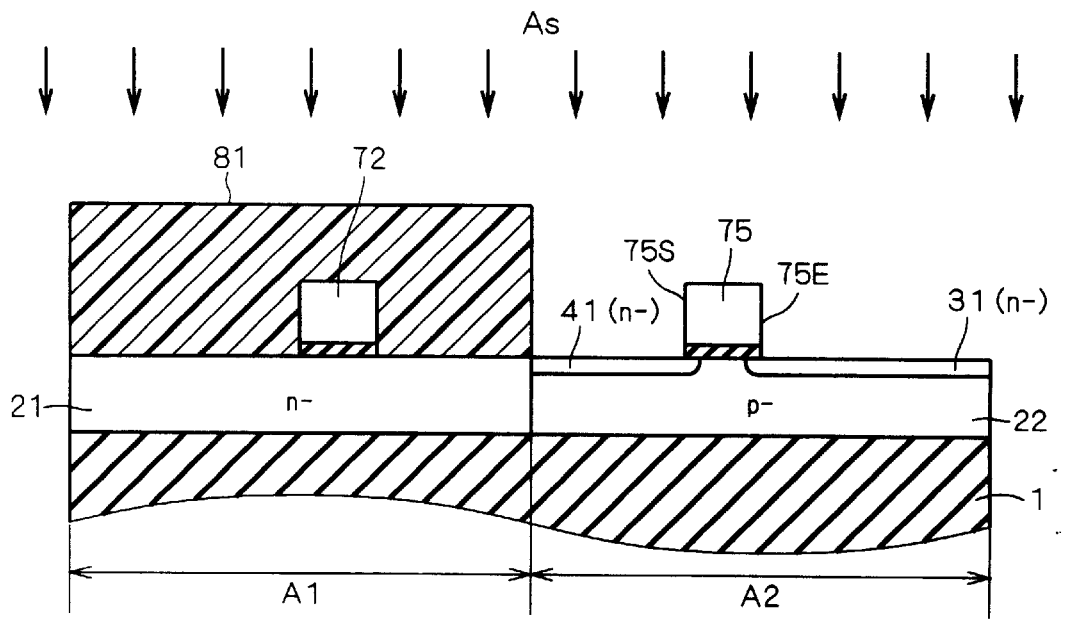
Figure 12B:
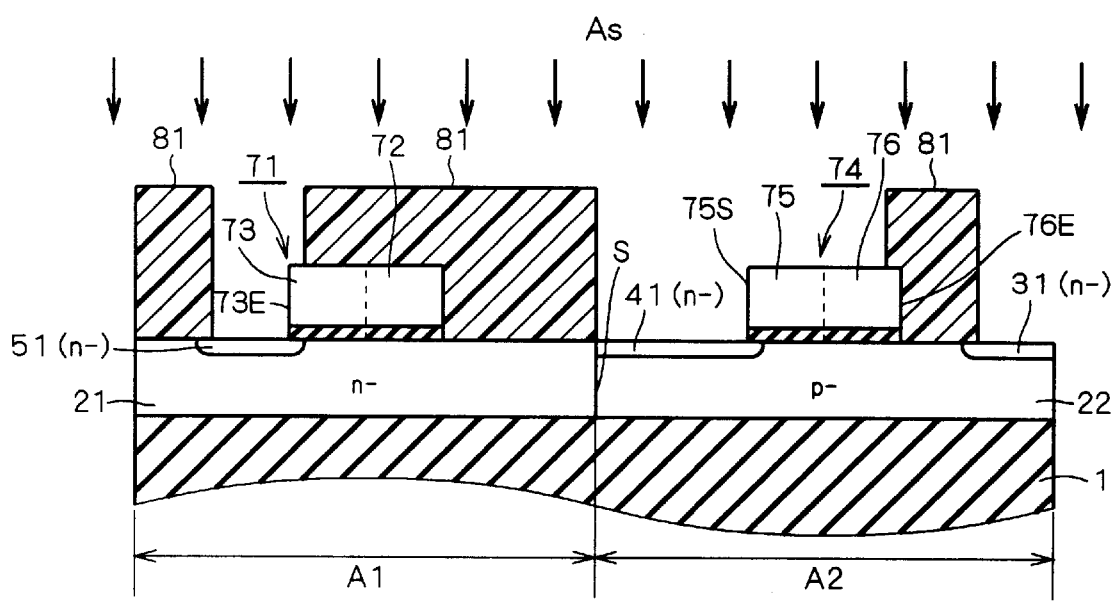

Next performed is an impurity implantation for forming a low-concentration impurity region in the LDD structure of the NMOS transistor. For example, arsenic implantation is performed (see FIGS. 12A and 12B). In this case, a resist 81 is so formed as to entirely cover the structure formed on the region A1 at the position Q7—Q7 as shown in FIG. 12A and cover also a portion where the body-potential drawing region 54 of the NMOS transistor is to be formed later at the position Q8—Q8 as shown in FIG. 12B. In the region A2, arsenic is introduced into a surface of the semiconductor layer 22 ranging from the boundary S to the straight portion 75, to form an n⁻ type semiconductor region 41.

As shown in FIG. 12B in more detail, the resist 81 covers a range from an end 76E of the wide portion 76 farther away from the boundary S to a portion at a certain distance from the boundary S. With the shape of the resist 81, arsenic is implanted into a surface of the semiconductor layer 22 at a certain distance from the end 76E of the wide portion 76, to form an n⁻ type semiconductor region 31. In FIG. 12A, the semiconductor region 31 extends to an end 75E of the straight portion 75 farther away from the boundary S.

At the portion Q8—Q8, the resist 81 is partially opened in the region A1 in consideration of use of a photomask as discussed later. As shown in FIG. 12B in more detail, the resist 81 is opened in a range from an end 73E of the wide portion 73 farther away from the boundary S to a portion at a certain distance from the boundary S. With this opening, arsenic is introduced into a surface of the semiconductor layer 21, to form an n⁻ semiconductor region 51.

In an impurity implantation, usually, an impurity is diffused also below the masked position. Therefore, the semiconductor region 51 is slightly extended to a position closer to the boundary S than the end 73E of the wide portion 73, the semiconductor region 41 is slightly extended to a position farther away from the boundary S than an end 75S of the wide portion 75, and the semiconductor region 31 is slightly extended to a position closer to the boundary S than the end 75E of the wide portion 75.

Through the above impurity implantation, arsenic is introduced into at least the straight portion 75 in the gate electrode 74, to enhance the conductivity thereof. In some cases, the arsenic is not necessarily introduced into a portion in the vicinity of the end 76E of the wide portion 76. That is because the resist 81 also covers the end 76E in order to avoid extension of the semiconductor region 31 to a portion below the end 76E of the wide portion 76. Since the wide portion 76 serves as a mask for disposing the body-potential drawing region 54 so as to be away from the straight portion 75 rather than as a gate electrode, the conductivity of the wide portion 76 is not needed to be high.

Next, the resist 81 is removed, and then an impurity implantation is performed to form a low-concentration impurity region in the LDD structure of the PMOS transistor. For example, an ion implantation using boron fluoride ($BF_2$) is performed (see FIGS. 13A and 13B). At this time, a resist 82 is formed, which covers the whole structure formed on the region A2 at the position Q7—Q7 as shown in FIG. 13A and covers a position where the body-potential drawing region 53 of the PMOS transistor is to be formed later at the position Q8—Q8 as shown in FIG. 13B. The resist 82 can adopt a pattern complementary to that of the resist 81. In the region A1, boron is introduced into the surface of the semiconductor layer 21 ranging from the boundary S to the straight portion 72, to form a p⁻ type semiconductor region 42.

As shown in FIG. 13B in more detail, the resist 82 covers the end 73E of the wide portion and the semiconductor region 51. An end of the semiconductor region 51 farther away from the boundary S may be exposed. With the shape of the resist 82, boron is implanted into the surface of the semiconductor layer 21 at a certain distance from the end 73E of the wide portion 73 or further a surface of the end of the semiconductor region 51 farther away from the boundary S, to form a p⁻ type semiconductor region 32. In FIG. 13A, the semiconductor region 32 extends to an end 72E of the straight portion 72 farther away from the boundary S.

At the portion Q8—Q8, the resist 82 is partially opened in the region A2 in consideration of use of a photomask as discussed later. As shown in FIG. 13B in more detail, the resist 82 is opened in a range from the end 76E of the wide portion 76 to an end of the semiconductor region 31 closer to the boundary S. With this opening, boron is introduced into the surface of the semiconductor layer 22 or further the end of the semiconductor region 31 closer to the boundary S, to form a p⁻ semiconductor region 52.

In an impurity implantation, usually, an impurity is diffused also below the masked position. Therefore, the semiconductor region 52 is slightly extended to a position closer to the boundary S than the end 76E of the wide portion 76, the semiconductor region 42 is slightly extended to a position farther away from the boundary S than an end 72S of the straight portion 72, and the semiconductor region 32 is slightly extended to a position closer to the boundary S than the end 72E of the straight portion 72.

Through the above impurity implantation, boron is introduced into at least the straight portion 72 in the gate electrode 71, to enhance the conductivity thereof. In some cases, the boron is not necessarily introduced into a portion in the vicinity of the end 73E of the wide portion 73. That is because the resist 82 also covers the end 73E in order to avoid extension of the semiconductor region 32 to a portion below the end 73E of the wide portion 73. Since the wide portion 73 serves as a mask for disposing the body-potential drawing region 53 so as to be away from the straight portion 72 rather than as a gate electrode, the conductivity of the wide portion 73 is not needed to be high. Further, boron may be introduced into the end 76E of the wide portion 76. That is because the conductivity at this position is not needed to be high as mentioned earlier.

Figure 14A:
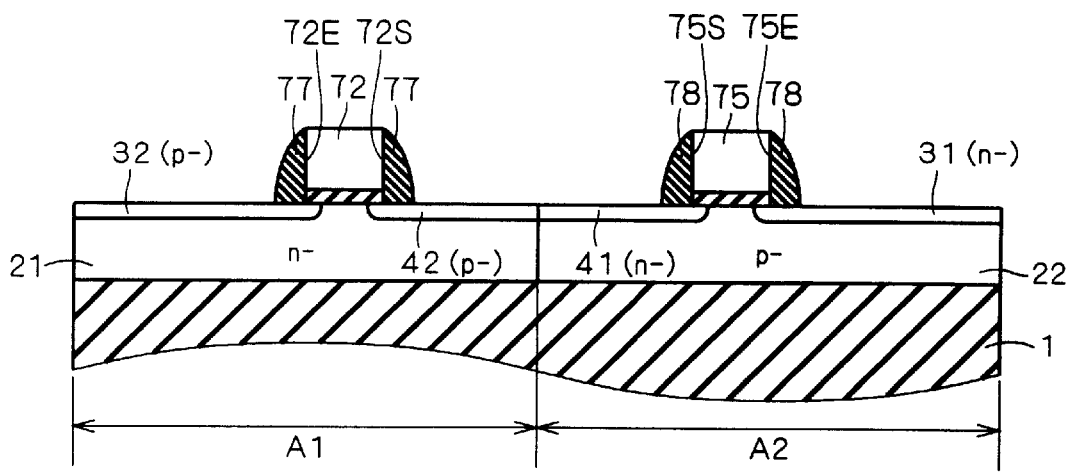
Figure 14B:
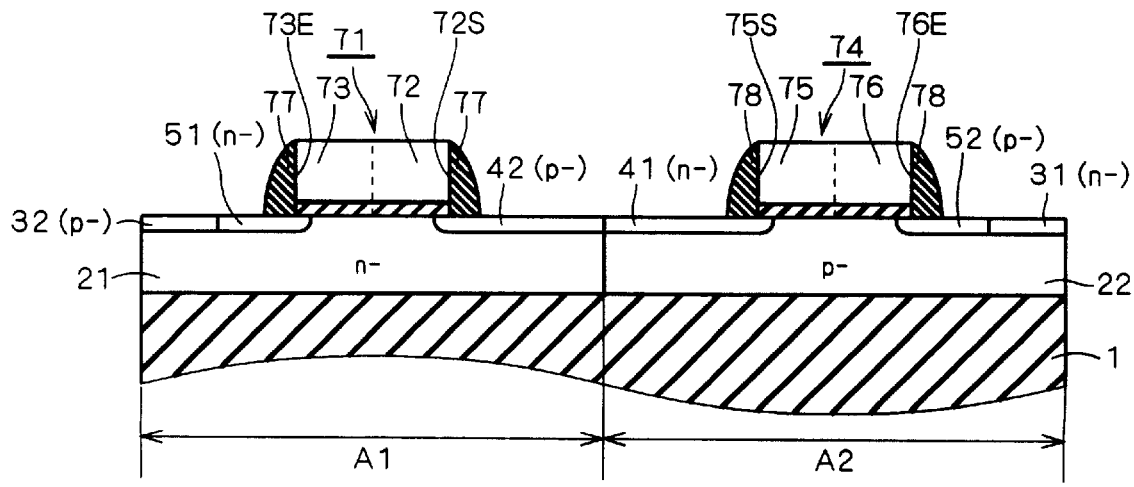

Next, the resist 82 is removed, and then the side walls 77 and 78 are formed by a well-known method (FIGS. 14A and 14B). In FIG. 14A, the side walls 77 appear on both ends 72S and 72E of the straight portion 72 and the side walls 78 appear on both ends 75S and 75E of the straight portion 75. In FIG. 14B, the side walls 77 appear on the end 72S of the straight portion 72 and the end 73E of the wide portion 73 and the side walls 78 appear on end 75S of the straight portion 75 and the end 76E of the wide portion 76.

Figure 15A:
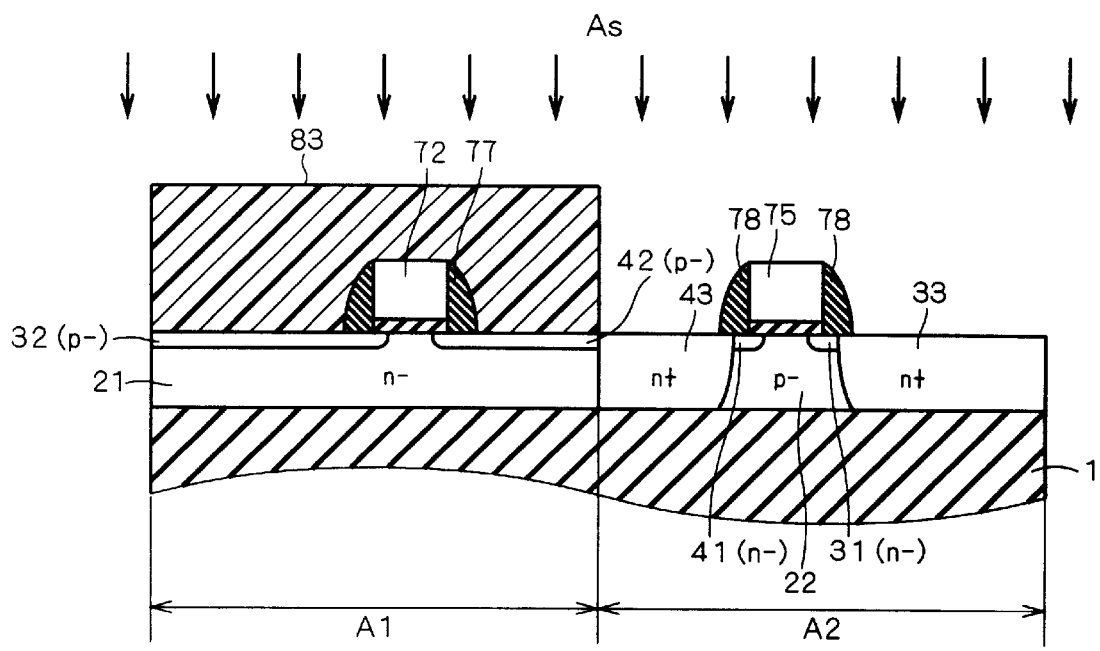

Next, an impurity implantation is performed to form a high-concentration impurity region in the LDD structure of the NMOS transistor. For example, an ion implantation using arsenic is performed (see FIGS. 15A and 15B). A resist 83 adopts the same pattern as that of the resist 81 shown in FIGS. 12A and 12B. At the position Q7—Q7 as shown in FIG. 15A, the n⁺ type source region 33 and the n⁺ type drain region 43 which have slight wraparounds below the side walls 78 are formed in the semiconductor layer 22 while the n⁻ type semiconductor regions 31 and 41 are left below the straight portion 75 and the side walls 78. At the position Q8—Q8 as shown in FIG. 15B, the n⁺ type body-potential drawing region 53 is so formed as to be surrounded by the semiconductor layer 21.

The resist 81 of FIGS. 12A and 12B adopts the same pattern as that of the resist 83 in order to divert the photomask for forming the body-potential drawing region 53. The existence of the semiconductor layer 51 does not inhibit formation of the body-potential drawing region 53 having the same conductivity and higher concentration. It is natural that the pattern of the resist 81 may cover the whole region A1 at the position Q8—Q8 like at the position Q7—Q7 if the above advantage in terms of photomask is not required.

Figure 15B:
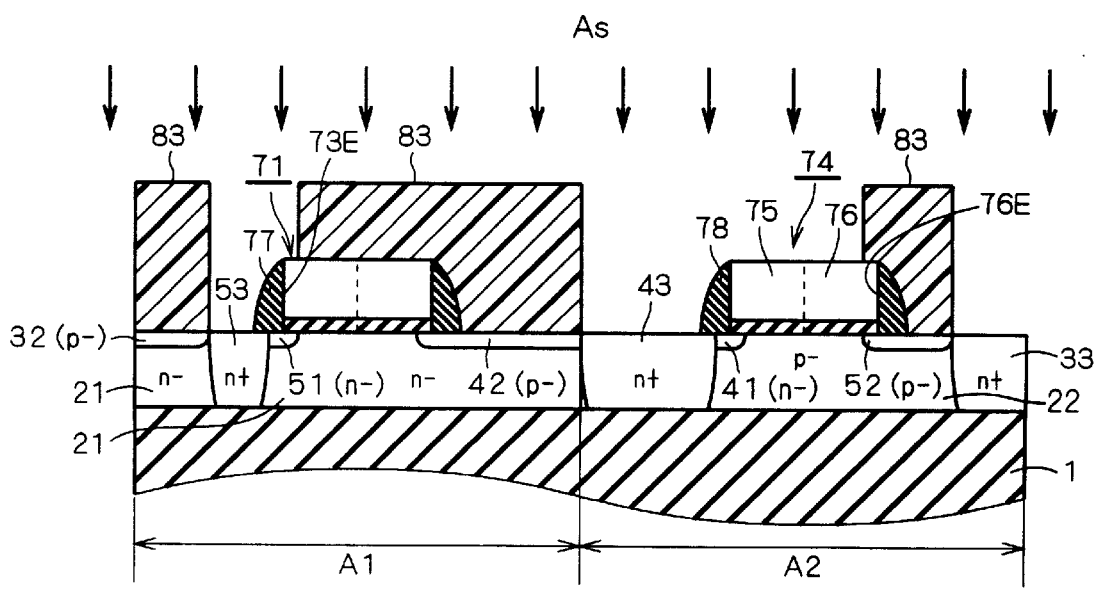

On the other hand, the resist 83 inhibits formation of the source region 33 in a range within a certain distance from the wide portion 76, in order not to inhibit formation of the p⁺ type body-potential drawing region 54 in the subsequent step by arsenic implantation in the step of FIGS. 15A and 15B. As mentioned earlier, arsenic may not be introduced into the end 76E of the wide portion 76 and arsenic may be introduced into the end 73E of the wide portion 73. On the other hand, the conductivity of the straight portion 75 is further enhanced.

Figure 16A:
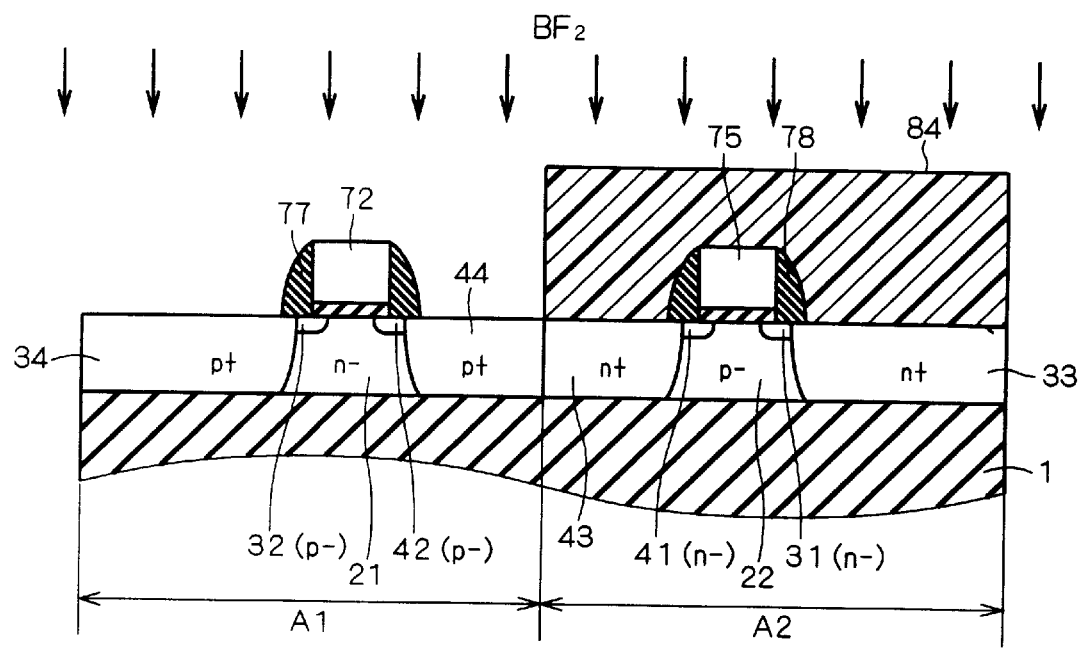
Figure 16B:
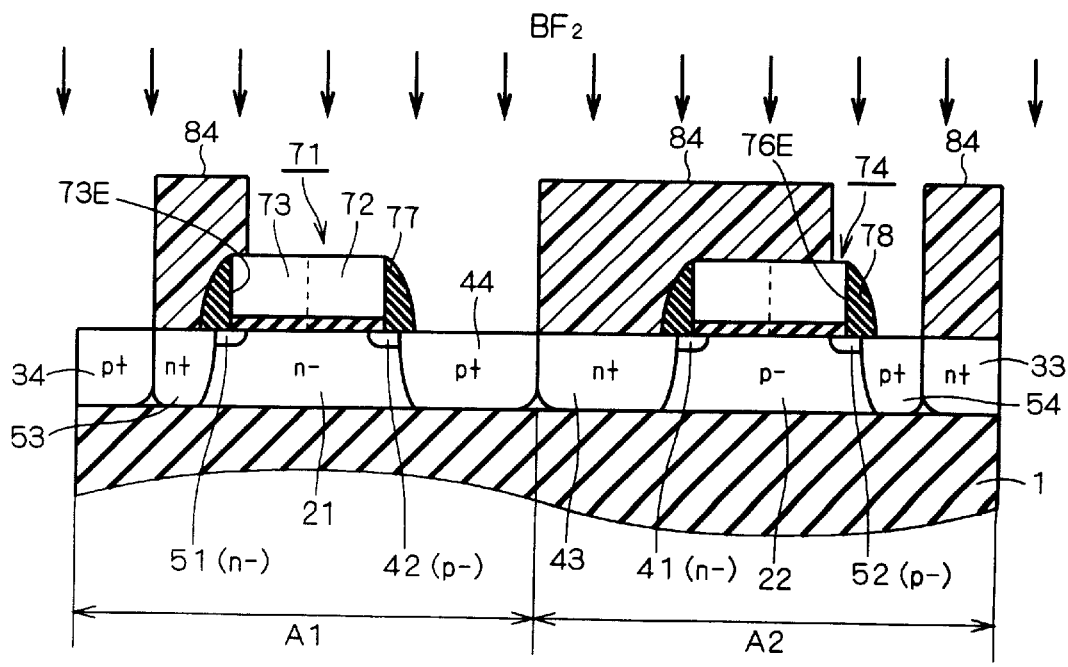

Next, the resist 83 is removed, and then an impurity implantation is performed to form a high-concentration impurity region in the LDD structure of the PMOS transistor. For example, an ion implantation using boron fluoride (BF) is performed (see FIGS. 16A and 16B). A resist 84 adopts the same pattern as that of the resist 82 shown in FIGS. 13A and 13B. At the position Q7—Q7 as shown in FIG. 16A, the p⁺ type source region 34 and the p⁺ type drain region 44 which have slight wraparounds below the side walls 77 are formed in the semiconductor layer 21 while the p⁻ type semiconductor regions 32 and 42 are left below the straight portion 72 and the side walls 77. At the position Q8—Q8 as shown in FIG. 16B, the p⁺ type body-potential drawing region 54 is so formed as to be surrounded by the semiconductor layer 22 and the source region 33. The resist 82 of FIGS. 13A and 13B adopts the same pattern as that of the resist 84 in order to divert the photomask for forming the body-potential drawing region 54. It is natural that the pattern of the resist 82 may cover the whole region A2 at the position Q8—Q8 like at the position Q7—Q7 if the above advantage in terms of photomask is not required.

On the other hand, the resist 84 inhibits formation of the source region 34 in a range within a certain distance from the wide portion 73, in order not to counter-dope the n⁺ type body-potential drawing region 53 formed in the preceding step by boron fluoride implantation in the step of FIGS. 16A and 16B. As mentioned earlier, boron may not be introduced into the end 73E of the wide portion 73 and boron may be introduced into the end 76E of the wide portion 76. On the other hand, the conductivity of the straight portion 72 is further enhanced.

Then, removing the resist 84 from the structure of FIGS. 16A and 16B, the structure of FIGS. 17A and 17B can be obtained.

Thus, in this preferred embodiment, since the impurities for forming the body-potential drawing regions 53 and 54 are introduced into the semiconductor layers 21 and 22 by using the wide portions 73 and 75 and the side walls 77 and 78 as masks, it is possible to dispose the body-potential drawing regions 53 and 54 so as to be away from the straight portions 72 and 75 of the gate electrodes 71 and 74. Formations of the body-potential drawing regions 53 and 54 do not invite count doping of the straight portions 72 and 75 and the conductivities of the gate electrodes 71 and 74 are not deteriorated. It is clearly advantageous that the conductivities of the gate electrodes 71 and 74 should not be deteriorated wherever the wide portions 73 and 75 are disposed along the directions where the straight portions 72 and 75 extend in the PMOS transistor and the NMOS transistor.

In this preferred embodiment, though the semiconductor regions 51 and 52 which are not needed in terms of electrical function are also formed in consideration of use of photomask, these semiconductor regions may not be formed as mentioned earlier. Further, the semiconductor regions 31, 32, 41 or 42 may not be formed, not to adopt the LDD structure. In this case, the steps of introducing impurities by using the resists 81 and 82 as discussed with reference to FIGS. 12A and 12B and FIGS. 13A and 13B, respectively, are not needed. In this case, clearly, the body-potential drawing region 53 of the PMOS transistor can be formed in the same step as the source region 33 and the drain region 43 of the NMOS transistor are formed, and the body-potential drawing region 54 of the NMOS transistor can be formed in the same step as the source region 34 and the drain region 44 of the PMOS transistor are formed, to thereby produce an effect of avoiding deterioration in conductivity of the gate electrodes 71 and 74.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   an insulator;
   a semiconductor layer on the insulator, the semiconductor layer having a first region, a second region, and a third region, the first region having a first conductivity type, the third region having a second conductivity type opposite to said first conductivity type;
   an insulating layer above the first region; and
   a control electrode provided on said insulating layer extending in a first direction,
   wherein the second region comprises:
      a first source region having said second conductivity type;
      a body-potential drawing region having said first conductivity type and being adjacent to said first source region; and
      a second source region having said second conductivity type and being adjacent to said body-potential drawing region wherein the first source region, the body-potential drawing region and the second source region are aligned along a side end of said control electrode.

2. The semiconductor device according to claim 1, wherein
   the first source region, the body-potential drawing region and the second source region have the same length along said second direction orthogonal to said first direction.

3. The semiconductor device according to claim 1, wherein
   the length along a second direction orthogonal to said first direction of the body-potential drawing region is shorter than those of the first source region and the second source region.

4. The semiconductor device according to claim 3, wherein
   the first source region and the second source region are connected farther away from said control electrode than an end portion of the body-potential drawing region away from said control electrode.

5. The semiconductor device according to claim 1, wherein said control electrode comprises:
   a straight portion extending in said first direction; and
   a wide portion widened in a second direction at a position of the body-potential drawing region in said first direction, said second direction being orthogonal to said first direction.

6. The semiconductor device according to claim 5, wherein
   the length along said second direction orthogonal to said first direction of the body-potential drawing region is shorter than those of the first source region and the second source region.

7. The semiconductor device according to claim 6, wherein
   the first source region and the second source region are connected farther away from said control electrode than an end portion of the body-potential drawing region away from said control electrode.

8. The semiconductor device according to claim 1, wherein the first source region, the body-potential drawing region, and the second source region extend from a bottom surface of the semiconductor layer to a top surface of the semiconductor layer.

9. A semiconductor device, comprising:
   a pair of semiconductor elements each including
   an insulator;
   a semiconductor layer on the insulator, the semiconductor layer having a first region, a second region, and a third region, the first region having a first conductivity type, the third region having a second conductivity type opposite the said first conductivity type;
   an insulating layer above the first region; and
   a control electrode provided on said insulating layer having a straight portion extending in a first direction and a wide portion widened in a second direction
   wherein the second region comprises:
      a first source region having said second conductivity type;
      a body-potential drawing region having said first conductivity type and being adjacent to said first source region and
      a second source region having said second conductivity type and being adjacent to said body-potential drawing region, wherein the first source region, the body-potential drawing region and the second source region are aligned along a side end of said control electrode,
   wherein each of the wide portions associated with the pair of semiconductor elements is at a position of said corresponding body-potential drawing regions in said first direction and is in opposite directions to each other.

10. The semiconductor device according to claim 9, wherein said pair of wide portions are widened in such directions as to go away from a boundary between said pair of semiconductor elements.

11. The semiconductor device according to claim 9, wherein the first source region and the second source region are connected farther away from said control electrode than an end portion of the body-potential drawing region away from said control electrode.

12. The semiconductor device according to claim 9, wherein the first source region, the body-potential drawing region, and the second source region extend from a bottom surface of the semiconductor layer to a top surface of the semiconductor layer.

* * * * *